United States Patent
Maclennan et al.

(10) Patent No.: US 7,576,451 B2
(45) Date of Patent: Aug. 18, 2009

(54) SELF POWERED GATE DRIVER SYSTEM

(75) Inventors: David Scott S. Maclennan, Ayr (CA); Kenneth Ronald Hilderley, Waterloo (CA)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 371 days.

(21) Appl. No.: 11/237,208

(22) Filed: Sep. 28, 2005

(65) Prior Publication Data

US 2007/0070557 A1    Mar. 29, 2007

(51) Int. Cl.
H01F 27/42 (2006.01)
H02M 7/00 (2006.01)
(52) U.S. Cl. ............... 307/412; 388/917; 363/57
(58) Field of Classification Search ........... 307/412; 388/917; 363/57
See application file for complete search history.

(56) References Cited

U.S. PATENT DOCUMENTS

| | | | |
|---|---|---|---|
| 5,579,215 A * | 11/1996 | Turuta | 363/57 |
| 5,796,599 A * | 8/1998 | Raonic et al. | 363/57 |
| 5,864,475 A * | 1/1999 | Ikawa et al. | 363/57 |
| 6,552,598 B2 * | 4/2003 | Gelman | 327/453 |
| 6,900,557 B1 * | 5/2005 | Gaudreau et al. | 307/113 |
| 7,009,853 B2 * | 3/2006 | Nagel et al. | 363/17 |

FOREIGN PATENT DOCUMENTS

| | | |
|---|---|---|
| EP | 0573836 | 12/1993 |
| EP | 0740388 | 10/1996 |

\* cited by examiner

*Primary Examiner*—Albert W Paladini
*Assistant Examiner*—Michael Rutland Wallis
(74) *Attorney, Agent, or Firm*—Fletcher Yoder, LLP; Alexander R. Kuszewski

(57) ABSTRACT

An apparatus and method used to charge a self powered gate driver system. The apparatus may include a current loop for inducing a current in a coil. A bridge rectifier may rectify the current induced in the coil and charge a capacitor used to power a driver in a self powered gate driver system. The current loop and coil may be separated by a dielectric to prevent current from passing between the self powered gate driver system and the current loop. The current loop may couple to a line voltage transformer to drive an alternating current through the current loop. In certain embodiments, a single current loop and transformer may charge a plurality of self powered gate driver systems.

20 Claims, 5 Drawing Sheets

SELF POWERED GATE DRIVER SYSTEM

BACKGROUND

The invention relates generally to the field of power control systems. More specifically, the invention relates to techniques for maintaining a charge in a self powered gate driver system during periods of inactivity.

Generally, motor controllers, and more generally, electrical controllers operate by limiting the power from a power supply that reaches a motor or other load. Some motor controllers limit the power delivered to a motor by intermittently conducting current between the power supply and the motor. These motor controllers typically couple to a sinusoidal ac power supply and conduct current during a portion of each cycle of the sinusoid. Correspondingly, to limit the power delivered to the motor, the motor controller may not conduct during a portion of each cycle. Typically, the duration of the period during which the motor controller does not conduct current is adjustable. Consequently, by adjusting the duration of this non-conductive period, the operation of the motor or some other load may be controlled.

Some motor controllers selectively transmit power by conducting current through a pair of silicon controlled rectifiers (SCRs). As is well known in the art, an SCR is a type of solid state switch that includes a rectifier controlled by a gate signal. Thus, when turned on by the gate signal, the SCR permit current to flow from its anode to its cathode but not in the reverse direction. Once turned on, the SCR typically remains on until the gate signal is removed and the current decreases to near zero. In the off state, the SCR usually does not conduct current in either direction.

By applying a gate signal at the appropriate times, a motor controller may regulate the power delivered to a load. Typically, a motor controller will employ a pair of SCRs (for each power phase) connected between the power supply and load in an inverse parallel relationship. Thus, when regulating an alternating current power supply, one SCR will be forward biased during the positive portion of the voltage/current cycle, and the other SCR will be forward biased during the negative portion of the voltage/current cycle. The motor controller may conduct current between power supply and the load by applying a gate signal to whichever SCR is forward biased. Similarly, the motor controller may prevent current from flowing by not turning on the forward biased SCR or by turning on the forward biased SCR at some time after it becomes forward biased. Thus, the more time during a cycle that an SCR is both turned off and forward biased, the less time current may pass between the power source and motor, as the reverse biased SCR will not conduct current. Consequently, the operation of the load may be controlled by increasing or decreasing the time between when an SCR becomes forward biased and when it is turned on in each cycle.

Typically, a motor controller includes circuitry for turning on the SCRs. A motor controller may include a driver that delivers a small current to the gate electrode of an SCR. The driver may time the pulse of current to the gate electrode to regulate the power delivered to the motor. To deliver more power, the driver will delay for less time after a SCR becomes forward biased before turning on the SCR. Similarly, to reduce the power delivered to the motor, the driver will delay a longer period after a SCR becomes forward biased before turning on the SCR and permitting current to pass. Each driver includes circuitry for determining when to turn on the SCR. Typically, motor controllers employ one driver for each SCR. Thus, a motor controller regulating a single phase of ac power typically employs two drivers, whereas a three phase controller includes six.

Powering the operation of the drivers presents challenges. Often, the drivers connect to an SCR that is exposed to high voltages. For example, SCRs often connect to power supplies that operate at 2300 volts or higher. Thus, it may be important to keep the driver electrically isolated from other parts of the system. Some systems employ a single power supply for each driver. However, dedicated power supplies for each driver may add to system costs, the size of the system, and the number of components that may fail. Moreover, motor controllers often employ a large number of drivers. For example, as noted above, a motor controller that regulates power from a three phase ac power supply may employ six drivers, one for each of the two SCRs for each phase. Similarly, to regulate the power from higher voltage power supplies, a motor controller may employ two or more pairs of SCRs for each phase. Thus, a three phase system with three SCR pairs for each phase may employ 18 SCRs and 18 drivers. Consequently, powering each driver with a dedicated power supply becomes less desirable as the number of switches and drivers increases.

With some success, designers turned to self powered gate driver systems (SPGDSs) to avoid these issues. Typically, SPGDSs capture energy from the power supply driving the load (i.e., line power). Often, within an SPGDS, a series of capacitors connect to self powered circuitry that charges the capacitors. The SPGDS may exploit voltage differentials across the SCRs to draw current and store a charge. The charge on the capacitors can then be used to power the drivers. The voltage differentials exploited to charge the capacitors typically occur during the operation of the SCRs. As the SCRs intermittently conduct current between the power source and load, a voltage differential may form across the SCRs. Advantageously, a self powered system may avoid the isolation issues associated with dedicated power supplies for each driver. Also, the cost of the components directed toward powering the drivers may be lower in a self powered system than in a system employing dedicated power supplies for each driver.

However, SPGDSs are in need of improvement. When transitioning from certain modes of operation, the capacitors may lack enough charge to power the drivers. Consequently, a re-activated SPGDS may exhibit a delay before conducting current as the capacitors charge over a few cycles. For example, during full speed operation, some systems bypass the SCRs to deliver power directly from the power supply to the motor. Without a voltage differential across the SCRs, the capacitors may discharge, leaving the drivers without a source of power. Thus, when such a system transitions from full speed operation to a mode where the SPGDS limits the power delivered to the motor, the capacitors powering the driver may lack sufficient charge to restart the driver. The SCRs may remain off for a number of cycles while the capacitors build up a charge sufficient to power the drivers. Similarly, during system startup, the capacitors may have discharged due to a lack of potential across the SCRs. Consequently, during a transition from one of these periods of inactivity, the system may not respond for a few cycles as the capacitors recharge. During this delay, the SCRs may remain off, resulting in an abrupt transition in the power reaching the motor. These sudden transitions may lead to current and torque surges that could contribute to wear on various components within the system.

There is a need in the art for a system that maintains a charge in these SPGDSs during periods of inactivity. There is a particular need for accomplishing this without incurring the costs associated with individual power supplies coupled to each driver.

BRIEF DESCRIPTION

In accordance with one exemplary embodiment, the present invention provides a pre-charge circuit to maintain a SPGDS in a state of readiness. The pre-charge circuit couples to a control power source through a transformer to receive power. The transformer induces an alternating current in a current loop in the pre-charge circuit. The alternating current passing through the current loop induces a current in a number of coils wrapped around the current loop. The coils are electrically isolated from the current loop by a layer of insulation. The induced currents within the coils are rectified and delivered to an energy storage device in a SPGDS. Advantageously, the current loop and the coils are electrically isolated from one another so the SPGDS can operate at much higher voltages than the control power source without current flowing between the two. At the same time, the pre-charge circuit delivers a trickle charge to the SPGDS, maintaining the SPGDS in a state of readiness even when the SPGDS is inactive.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The embodiments presented below represent improvements to SPGDSs. As noted above, in conventional SPGDSs, the circuitry directed toward powering the drivers, the self powering circuitry and capacitors, may respond slower than desired when transitioning from a mode of operation where the SPGDS is inactive. During periods of inactivity, the capacitors that power the drivers may discharge, leaving the drivers without power while the capacitors recharge during the first few cycles after the SPGDS is activated. This charge up delay may prove problematic during a slow stop operation, where the SPGDS slows a load operating at full power in a controlled manner. Often, a load operating at full power receives current directly from the power supply, bypassing the SPGDS. When the SPGDS is re-engaged, the SCRs may remain nonconductive for a number of cycles while the capacitors that power the drivers recharge. Once the drivers receive sufficient power from the capacitors, the drivers may begin to deliver pulsed signals to the gate electrodes of the SCRs, permitting current to flow. The sudden transition from full current to no current and back to a regulated current may produce current and torque surges that increase wear on the equipment being controlled. A system to eliminate these transitory effects, in accordance with the invention, without reintroducing the costs and problems associated with a dedicated power supply for each driver, may improve SPGDSs.

Figure 1:
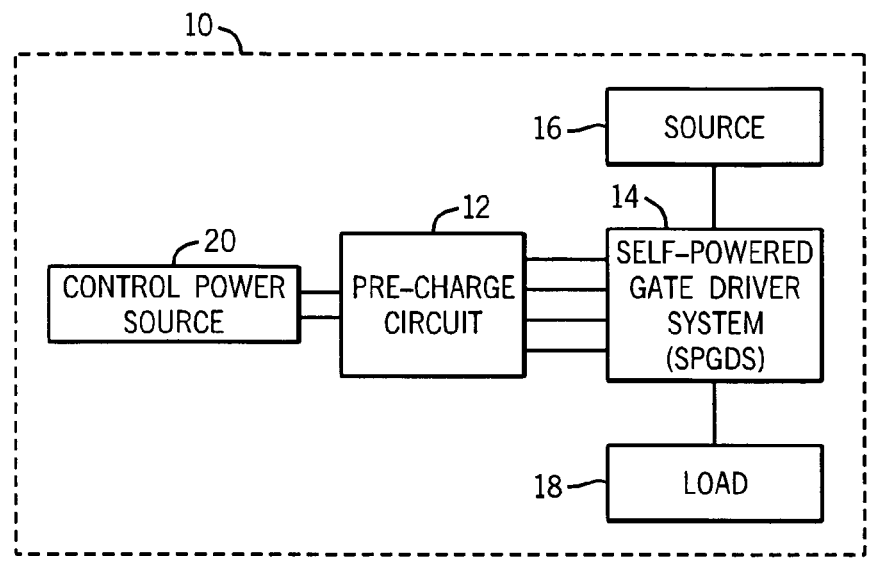
FIG. 1 is a diagrammatical view of an exemplary automation system including an SPGDS that receives a charge from a pre-charge circuit.
Figure 2:
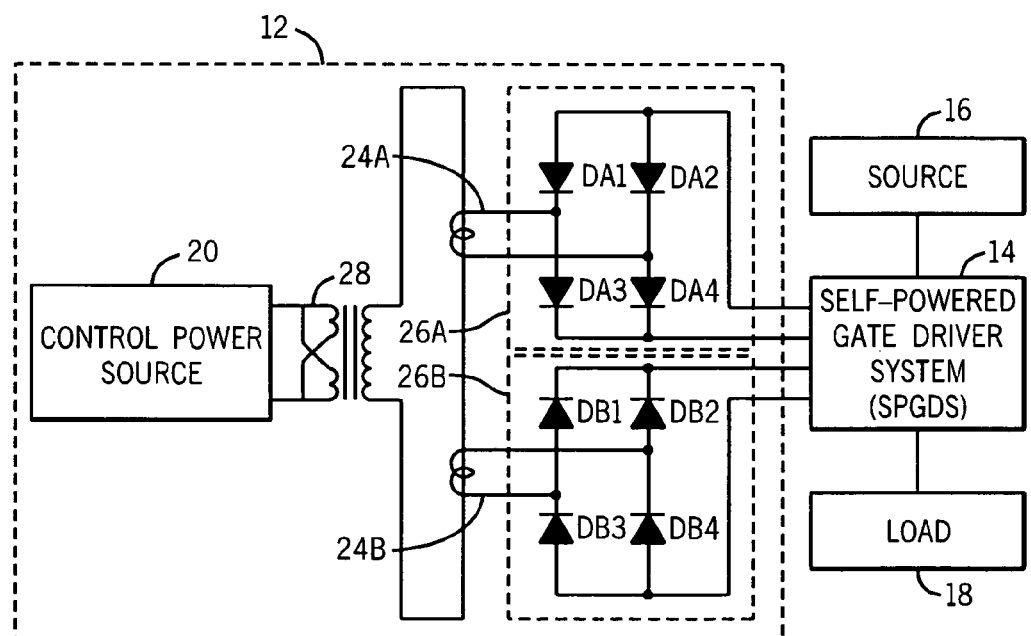
FIG. 2 is a more detailed diagrammatical view of the system of FIG. 1 with a circuit diagram of a pre-charge circuit substituted for a pre-charge circuit block.
Figure 3:
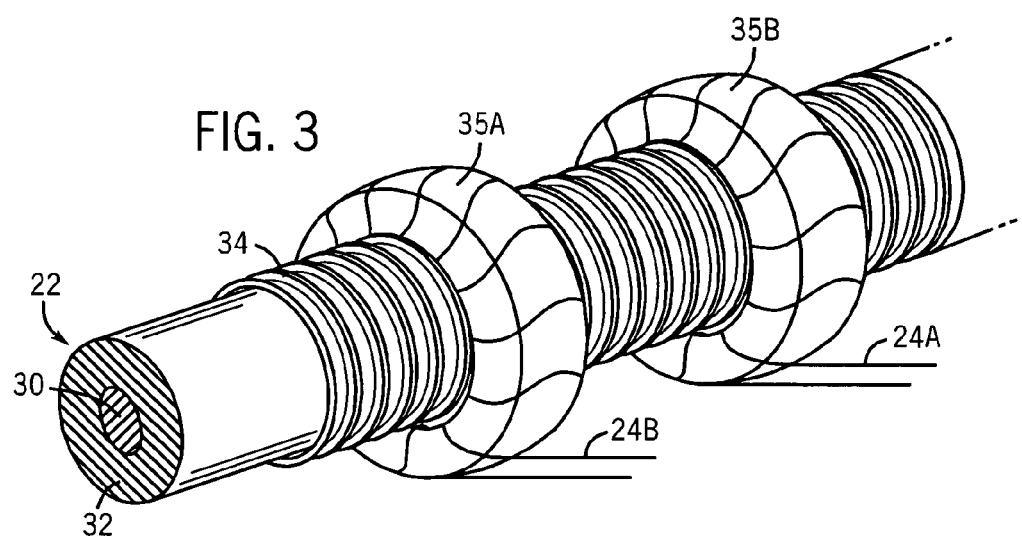
FIG. 3 is a cutaway perspective view of a current loop coupled to a pair of coils for use in a system of the type shown in the previous figures.
Figure 4:
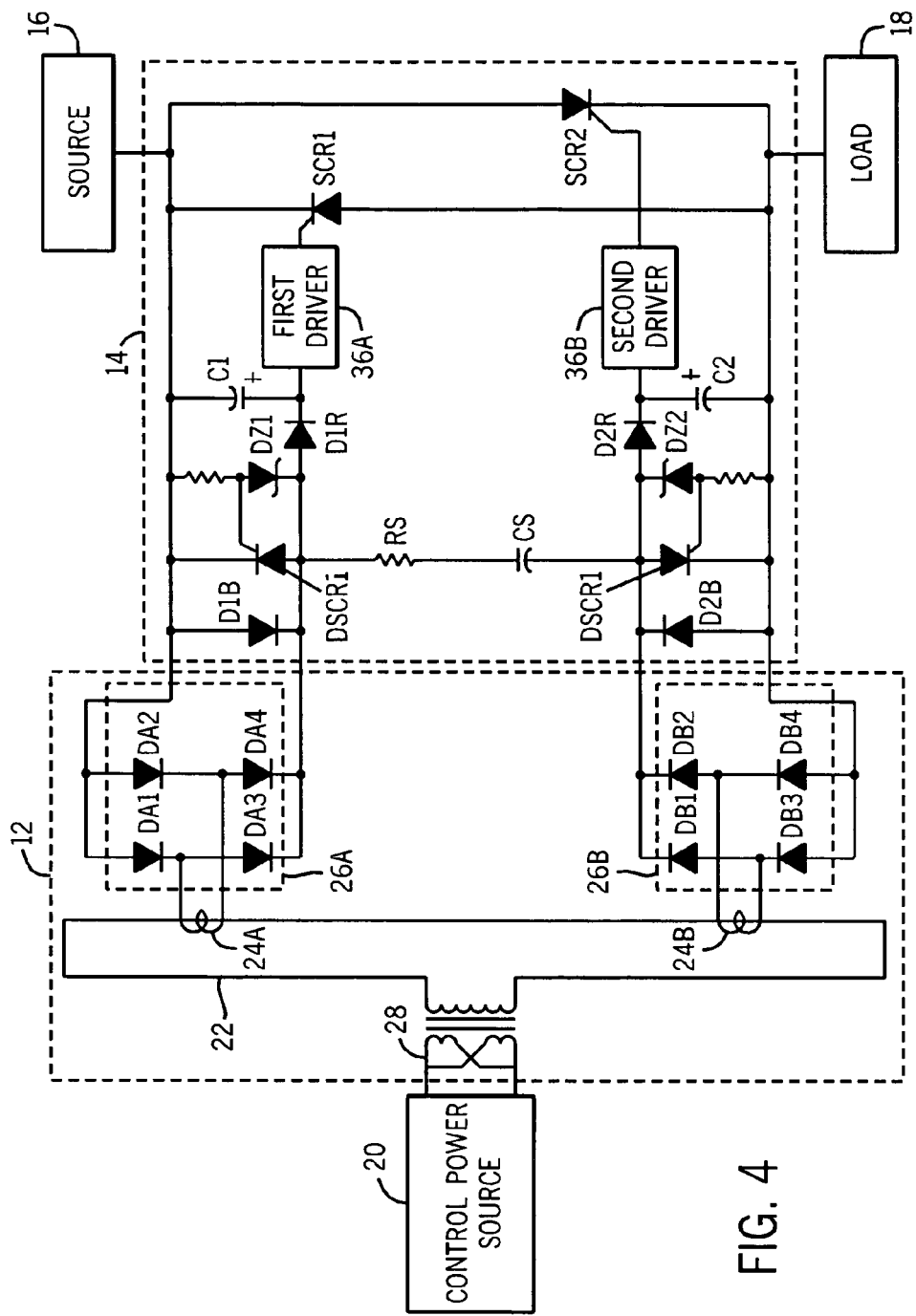
FIG. 4 is a circuit diagram of an SPGDS coupled to a pre-charge circuit in accordance with aspects of the invention.

Embodiments of the present technique may address these issues with SPGDSs while preserving many of the advantages of SPGDSs over systems employing a dedicated power supply for each driver. Several such embodiments are described below. To simplify explanation of the present technique, FIG. 1 depicts an exemplary embodiment employing a single SPGDS directed toward regulating power from a single phase ac power supply provided to a load, such as an electric motor. FIGS. 2-4 explain the embodiment of FIG. 1 in more detail with circuit diagrams and a cross section of one component. Later figures will add complexity by introducing exemplary embodiments directed toward three phase ac power supplies and exemplary embodiments that control higher voltage power supplies by stacking SPGDSs in series.

Turning to the first embodiment, FIG. 1 depicts an exemplary automation system 10 in accordance with the present techniques. The automation system 10 of FIG. 1 may exemplify any number of systems controlling the operation of some load. In one instance, the automation system 10 may exemplify systems employing ac to ac motor control, such as automation systems directed toward pumping fluids, operating conveyor belts, air and gas handling, or other forms of factory automation, for example.

The automation system 10 may include a pre-charge circuit 12 to maintain an SPGDS 14 in a ready state. During periods of inactivity, when energy stored within the SPGDS 14 might otherwise dissipate, the pre-charge circuit 12 may deliver a small current to keep the SPGDS 14 ready to respond without a charge-up delay when re-activated. The components directed toward delivering and storing this energy will be described in much greater detail below. Advantageously, certain embodiments of a single pre-charge circuit 12 may deliver a current sufficient to maintain an SPGDS 14 with two drivers in a ready state. Indeed, as will be illustrated in subsequent figures, a single pre-charge circuit 12 may deliver current sufficient to maintain multiple SPGDSs 14 in a ready state. However, the present techniques are not limited to embodiments employing a single pre-charge circuit 12, as other embodiments may employ multiple pre-charge circuits 12 to provide redundant current sources, for example.

An SPGDS 14 may connect to the pre-charge circuit. The SPGDS 14 may include some energy storage device to receive energy from the pre-charge circuit, such as a capacitor, inductor, or battery, for example. Additionally, the SPGDS 14 may include self powered circuitry to capture energy as the SPGDS 14 operates and charge the energy storage device. For example, the self powered circuitry may exploit voltage differentials across the SPGDS 14 to charge a capacitor. To control a current passing through the SPGDS 14, it may include a some device of variable conductance, such as a thyristor, silicon controlled rectifier, metal oxide semiconductor gated thyristor, thyratron, transistor, gate turn off thyristor, insulated gate bipolar transistor, metal oxide semiconductor field effect transistor, field controlled diodes, junction field effect transistors, static induction transistor, or bipolar junction transistor, for example. A circuit diagram of an exemplary SPGDS 14 is illustrated in FIG. 4 and discussed in more detail below.

The SPGDS 14, when active, may control the current between a source 16 and a load 18. The source may include various sources of electrical energy, such as an ac or dc power supply, for example. In the case of an ac power supply, the current driven by the source 16 alternates directionally in a sinusoidal manner, as a square wave, as a triangle wave, in an irregular fashion, or in any other form of alternating current. The load may include any device adapted to harness the current driven by the source. For example, the load 18 may include an electric induction motor, a heating element, an electrochemical process, or an electric arc. As is described in greater detail below, the SPGDS 14 may control the operation of the load 18 by selectively permitting current to flow between the source 16 and the load 18.

To draw power, the pre-charge circuit 12 is coupled to a control power source 20. The control power source 20 may be any ac power source with sufficient capacity to enable the pre-charge circuit 12 to energize the SPGDS 14. For example, to reduce costs, the control power source may be a simple line frequency source, such as a 60 Hz, 120 v ac source as is commonly available in North America or a 50 Hz, 220 v ac source as is commonly available in Europe. However, control power sources 20 operating at other voltages and frequencies may also be employed. Because the demands placed on control power source 20 by the pre-charge circuit 12 may be much smaller than the demands placed on the source 16 by the load 18, the root mean square (RMS) voltage supplied by the control power source 20 may be much smaller than the RMS voltage supplied by the source 16. For example, the RMS voltage of the control power source 20 may be smaller than one half or smaller than one tenth of the RMS voltage of the source 16.

In operation, the pre-charge 12 circuit may continuously deliver a small charge to the SPGDS 14, ensuring the components within the SPGDS 14 that power its operation maintain sufficient reserves of stored electrical energy to re-start the SPGDS 14 without delay. When activated, the SPGDS 14 may still draw power from the pre-charge circuit 12, but the self powered circuitry will draw the bulk of the SPGDS 14 power by exploiting voltage differentials generated as the SPGDS 14 intermittently blocks current flow between the source 16 and the load 18. However, it should be noted that applications of the present technique are not limited to precharge circuits 12 which continuously charge the SPGDS 14, as the pre-charge circuit 12 may operate intermittently in some embodiments. When the SPGDS 14 is inactive, the charge provided by the pre-charge circuit 12 may prevent the components powering the SPGDS from becoming de-energized.

Advantageously, the pre-charge circuit 12 may transmit power from the control power source 20 to the SPGDS 14 while keeping the SPGDS electrically isolated. Electrical isolation may be important because the SPGDS 14 may experience voltages from the source 16 and load 18 that are much larger than the peak voltage of the control power source 20. Thus, the pre-charge circuit 12 may keep the SPGDS 14 isolated.

To illustrate a pre-charge circuit 12 in more detail, FIG. 2 depicts a circuit diagram of an exemplary pre-charge circuit 12 included within an automation system 10. To prevent current from flowing between the SPGDS 14 and the control power source 20, the pre-charge circuit may include an insulated current loop 22 that passes through coils 24A and 24B.

The current loop 22 may be a wire of sufficient length to extend through the coils. As is depicted in greater detail in FIG. 3, the coils 24A and 24B may be wrapped around the current loop 22 insulation, preventing current from passing from the coils 24A and 24B to the current loop 22. However, due to their proximity, an alternating current passed through the current loop 22 may induce a current in the coils 24A and 24B. This induced current may be harnessed to maintain a charge in the SPGDS 14.

A pair of bridge rectifiers 26A and 26B may rectify alternating currents induced in the coils 24A and 24B. The bridge rectifiers 26A and 26B are disposed between the SPGDS and the coils 24A and 24B respectively. The bridge rectifiers convert an alternating current within the coils 24A and 24B into a unidirectional current that may be employed to charge storage capacitors within the SPGDS (see, e.g., FIG. 4). As is well known in the art, a bridge rectifier may include four diodes (e.g., DA1-DA4) in bridge arrangement to achieve full-wafer rectification. However, it should be noted that other embodiments in accordance with the present technique may employ other devices to rectify the current from the coils, such as a half wave rectifier, for example. The present embodiment includes one coil and bridge rectifier per driver within the SPGDS 14 (See FIG. 2 or 4). However, it should be noted that other embodiments in accordance with the present technique may include fewer or more coils or rectifiers, as the power requirements of drivers may vary.

The pre-charge circuit 12 may include a transformer 28 to step down the voltage from the control power source 20, as the impedance of the current loop 22 may be very low. The transformer 28 may be a simple line transformer adapted to step the voltage from the control power source down to 0.6 volts, for example. However, other embodiments in accordance with the present technique may employ transformers outputting different voltages.

The length and gauge of the current loop 22 may be important to ensure sufficient current is induced in the coils 24A and 24B. In some embodiments, the current loop employs between number 4 and number 8 gauge wire that is between 10 and 30 feet in length. For example, certain embodiments may employ a 21 foot long current loop 22 of number six gauge wire. A current loop of these dimensions coupled to a transformer 28 outputting 0.6 volt alternating current may carry an approximately 50 amp alternating current within the current loop 22. Coils 24A and 24B disposed around this current loop 22 may include an appropriate number of windings to energize the capacitors within the SPGDS 14 during periods of inactivity.

The present embodiment employs a pair of coil loops 24A and 24B with a pair of bridge rectifiers 26A and 26B to charge a SPGDS that employs two drivers (See FIG. 4). Thus, the present embodiment employs a coil and a bridge rectifier for each driver. However, it should be noted that other embodiments may employ components arranged in other ratios. For example, some embodiments in accordance with the present technique may employ a single coil and rectifier to supply a plurality of drivers, multiple coils and multiple rectifiers to supply a single driver, or multiple coils coupled to a single rectifier and driver, for example.

Advantageously, by employing a current loop 22, the output of a single transformer 28 may be harnessed to power a plurality of drivers within a plurality of SPGDSs 14. As subsequent figures illustrate, by adding coil loops, such as coil loops 24A and 24B, to pre-charge circuit 12, a single transformer 28 may support additional SPGDSs 14 and their associated drivers.

However, before addressing systems employing multiple SPGDSs 14, the arrangement of the coils 24A and 24B around the current loop 22 is described in further detail. FIG. 3 depicts a cutaway perspective view of coils 24A and 24B disposed around the current loop 22. As previously described, an alternating current within the current loop 22 may induce a current in the coils 24A and 24B, which may be used to charge the SPGDS 14 during periods of inactivity. To this end, in the present embodiment, the coils 24A and 24B each include a toroidal magnetic core 35A and 35B respectively disposed around the current loop 22. At the same time, current may not flow from the SPGDS 14, which may regulate high voltage power, to the current loop 22, which may operate at much lower voltages.

The current loop 22 may include a conductive core 30 with a layer of insulation 32 to prevent current from flowing through the coils 24A and 24B to the current loop 22. The insulation layer 32 may have a sufficient thickness and dielectric strength to prevent current from flowing from the coils 24A and 24B to ground. For example, the insulation layer 32 may include a layer of silicon rated at 50 kv dc. However, it should be noted that other embodiments may employ other insulators, such as polytetrafluoroethylene, glass braid, ceramic fiber, polyethylene, polypropylene, or any other material with a sufficient dielectric strength.

To further isolate the conductive core 30 of the current loop 22 from the coils 24A and 24B, the pre-charge circuit 12 may include an insulating sleeve 34 disposed around the current loop conductor 22. The sleeve 34 may be made of a plastic or any other material with sufficient dielectric strength. To increase its mechanical strength, the sleeve 34 may be corrugated. Advantageously, the sleeve 34 may protect softer insulators 32 from mechanical damage when installing the current loop 22 through the coils 24A and 24B. Additionally, the sleeve 34 may facilitate removal and replacement of current loop 22.

To describe an exemplary SPGDS 14 in more detail, FIG. 4 illustrates a circuit diagram of a SPGDS 14 coupled to a pre-charge circuit 12. As previously described, the pre-charge circuit 12 may couple to a control power source 20 to deliver a charge to the SPGDS 14. To govern the operation of a load 18, the SPGDS 14 may be disposed in series between a source 16 and a load 18.

The SPGDS may control the flow of current between the source 16 and the load 18 by employing a pair of SCRs, denoted SCR1 and SCR2. As previously described, in operation a SCR may function like a rectifier controlled by a gate signal. Thus, when turned on by applying a voltage or current to the gate, the SCR may exhibit low forward resistance and high reverse resistance, much like a diode. However, when the gate signal is removed, the SCR may remain in an on state until the current through it ceases. At which point, the SCR may turn off and exhibits high forward and reverse resistance. As a result of these properties, by turning a SCR on at the appropriate times, the SCR may be used to regulate an alternating current. Thus, taking SCR1 for example, if no gate signal is sent to SCR1, very little current may pass through it. If a gate signal is sent to SCR 1, it may function like a half wave rectifier, passing most current flowing in one direction. Because a SCR may turn off when reverse biased, a gate signal may be repeatedly applied each time the SCR becomes forward biased, as a portion of each cycle may reverse bias the SCR. Significantly, by turning a SCR on some time after it becomes forward biased in each cycle, the current between the source 16 and the load 18 may be controlled. The more time during each cycle that a SCR is both forward biased and off, the less time current passes between the source 16 and the load 18. Thus, to limit the energy delivered to the load 18, for example to slow the rotation of an induction motor, the SPGDS 14 may turn on SCR1 or SCR2 some time after they become forward biased in each cycle. The SPGDS 14 may control the operation of the load by adjusting the magnitude of this delay. The SPGDS 14 may employ a pair of SCRs, SCR1 and SCR2, in an inverse parallel relationship, so one of the SCRs is forward biased during each half of a cycle. Thus, the SPGDS 14 may control the current between the source 16 and the load 18 during both the positive and negative portions of each cycle.

A pair of drivers 36A and 36B may each control one of SCR1 and SCR2. To govern when SCR1 and SCR2 turn on, each driver 36A and 36B may couple to the gate electrode the SCR it controls. Thus, the drivers 36A and 36B may turn on SCR1 and SCR2 respectively. The drivers 36A and 36B may include circuitry to determine the appropriate point in each cycle to turn on SCR1 and SCR2 to deliver the desired power to the load 18. Each of the drivers 36A and 36B may draw power to operate from other components of the SPGDS 14.

A pair of capacitors C1 and C2 may store a charge to power one of the drivers 36A and 36B respectively. Capacitor C1 may be disposed in series between the source 16 and driver 36A, while capacitor C2 may be disposed in series between the load 18 and driver 36B. By cooperating with various components that are subsequently discussed, capacitors C1 and C2 may exploit a potential across SCR1 and SCR2 to capture a charge. The drivers 36A and 36B may draw down this charge to power their operations. Advantageously, such an arrangement may permit the SPGDS 14 to operate without the aid of a dedicated power supply for each of the drivers 36A and 36B.

Various components may cooperate to charge the capacitors C1 and C2 that power the drivers 36A and 36B. A capacitor CS may charge when both SCR1 and SCR2 are off and then discharge into C1 and C2. Depending upon whether SCR1 and SCR2 are both off during a positive or negative portion a voltage cycle, current may flow through diodes D1B or D2B to charge CS. At the same time, current may flow from capacitor CS to one of capacitors C1 or C2. If capacitor CS is charging through diode D1B, then current may flow from capacitor CS to capacitor C2 through diode D2R to charge capacitor C2. Similarly, if capacitor CS is charging though diode D2B, then current may flow from capacitor CS through diode D1R to charge capacitor C1. Diodes D1R and D2R permit current to flow from capacitor CS into capacitors C1 and C2 respectively. At the same time, they may block current from leaving capacitors C1 and C2 by a path other than through drivers 36A and 36B. Advantageously, by including a resistor RS in series with a capacitor CS, these two components may form a snubber circuit to dampen transient currents generated during abrupt transitions in current through the SPGDS 14, such as when SCR1 or SCR2 turns on.

Zener diodes DZ1 and DZ2 may each cooperate with various components to prevent the capacitors C1 and C2 from charging above a certain voltage. Diodes DZ1 and DZ2 may have a breakdown voltage, such as 20 volts, that serves to cap the voltage across capacitors C1 and C2 respectively. Diodes DZ1 and DZ2 may each couple to the gate electrode of an SCR, such as DSCR1 and DSCR2, to re-direct currents away from capacitor C1 or C2 when they are fully charged. For example, when both SCR1 and SCR2 are off during a portion of a cycle that would drive current from capacitor CS to capacitor C1, if the latter is fully charged, current may pass through diode DZ1 to turn on switch DSCR1. Once on, switch DSCR1 may re-direct current from capacitor CS that would other wise charge it back to the source 16. Diodes DZ2 and DSCR2 may operate in a complimentary manner. To ensure the gate electrode of switches DSCR1 and DSCR2 reach a voltage sufficient to turn them on when diodes DZ1 or DZ2 reach their breakdown voltage, resistors R1 and R2 may be disposed in series between diode DZ1 and the source 16 or diode DZ2 and the load 18 respectively.

The pre-charge circuit 12 may supplement the self powered circuitry by maintaining a charge on capacitors C1 and C2 when the SPGDS 14 is inactive. As previously explained, a control power source 20 may drive an alternating current through a current loop 22. The current loop 22 may induce a current in coils 24A and 24B, which is rectified by bridge rectifiers 26A and 26B. The output of bridge rectifiers 26A and 26B may charge capacitors C1 and C2 respectively. Thus, the pre-charge circuit may maintain a charge on capacitors C1 and C2 when the SPGDS 14 is inactive. Advantageously, when the SPGDS 14 is re-activated, such as during a soft stop operation, the SPGDS 14 may operate without delaying for the capacitors C1 and C2 to charge. Preventing this delay, may reduce current and torque surges and prolong the life of equipment.

Figure 5:
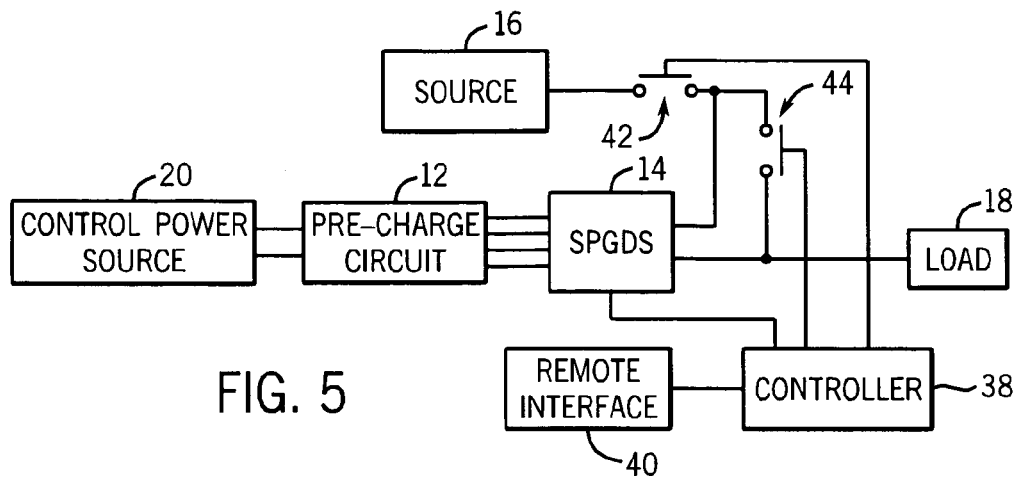
FIG. 5 is a diagrammatical view of an exemplary automation system including a controller and remote interface.

Various automation systems 10 may employ a pre-charge circuit 12 coupled to a SPGDS 14. To illustrate the operation of such an automation system 10 in more detail, FIG. 5 depicts a block diagram of an exemplary automation system 10 including components adapted to control the operation of a SPGDS 14. As in previous embodiments, a SPGDS 14 may selectively permit current to flow between a source 16 and a load 18, and a pre-charge circuit 12 may supply a trickle charge to the SPGDS 14. In addition to these components, the automation system 10 may include a controller 38 to govern the operation of the SPGDS 14 and various other components that exercise control over the load. The controller 38 may be communicatively coupled to the SPGDS 14 in a manner that permits the controller 38 to control the SPGDS 14. In response to commands from the controller 38, the SPGDS 14 may regulate the operation of the load 18.

The controller 38 may communicate with a remote interface 40 configured to facilitate control over the automation system 10 by a user. The remote interface 40 may include a display to convey information to users and some device through which users may input commands, such as a keyboard for example.

The controller 38 may communicate with contactors 42 and 44 to control the path of the current between the source 16 and the load 18. To decouple the load 18 from the source 16, the controller 38 may open contactor 42. Similarly, to direct the current between the source 16 and the load 18 through the SPGDS 14, the controller 38 may close contactor 42 and open contactor 44. In certain modes of operation, the controller 38 may divert the current between the source 16 and the load 18 away from the SPGDS 14 by closing contactor 44. For example, when the load 18 is to operate at full capacity, and current between the source 16 and the load 18 passes unrestrained by the SPGDS 14, the controller 38 may close contactor 44, bypassing the SPGDS 14. Thus, by directing the operation of the SPGDS 14 and the contactors 42 and 44, the controller 36 may regulate the current between the source 16 and the load 18.

Figure 6:
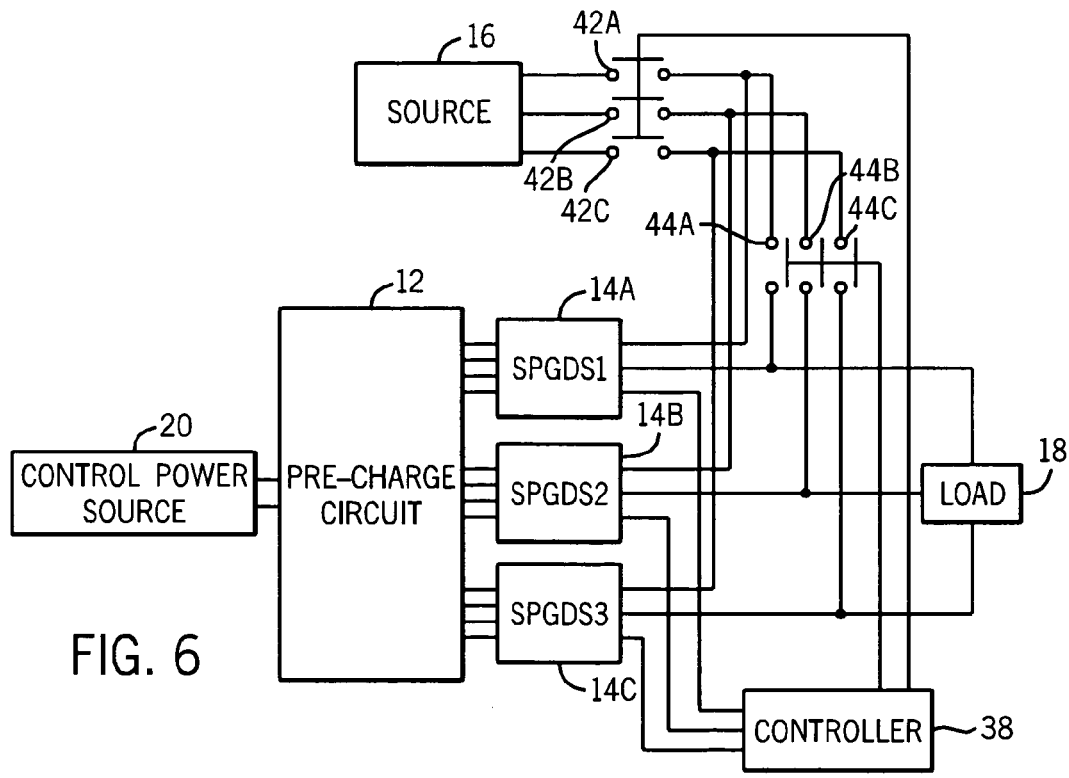
FIG. 6 is a diagrammatical view of an exemplary automation system configured with a three phase ac power source.

Certain embodiments in accordance with the present technique may employ a plurality of SPGDSs 14. For example, FIG. 6 depicts a block diagram of an exemplary automation system 10 controlling currents between a three phase power source 16 and a load 18. The source 16 may deliver power to the load 18 through three lines of alternating current, each line 120 degrees out of phase with the other two lines.

A SPGDS 14A-C may regulate each phase of ac between the source 16 and the load 18. As illustrated by FIG. 6, three SPGDSs 14A-C may be disposed in series between the source 16 and the load 18, each SPGDS 14A-C selectively conducting one phase. Thus, as with a single phase, the SPGDSs 14A-C may govern the operation of the load 18 by increasing or decreasing the portion a cycle during which they are non-conductive. A controller 38 may communicate with each SPGDS 14A-C to control their operation.

Similarly, the controller 38 may communicate with a series of contactors 42A-C and 44A-C to select a path for the current between the source 16 and the load 18. Thus, to decouple the load 18 from the source 16, the controller 38 may open contactors 42A-C. To bypass the SPGDSs 14A-C, the controller 38 may close contactors 44A-C, and to direct the current between the source 16 and the load 18 through the SPGDS 14A-C, the controller 38 may open contactors 44A-C and close contactors 42A-C.

Advantageously, a single pre-charge circuit 12, with appropriate modifications, may supply multiple SPGDSs. The pre-charge circuit 12 of FIG. 2 is readily modified to support multiple SPGDSs, such as SPGDSs 14A-C of FIG. 6. By adding a pair of coils similar to coils 24A and 24B and a pair of rectifiers similar to rectifiers 26A and 26B to the current loop 22 for each additional SPGDS 14, the pre-charge circuit 12 may power a plurality of SPGDS. Advantageously, a single transformer 28 and current loop 22 may be leveraged across multiple SPGDSs. Thus, one pre-charge circuit 12 may charge three SPGDSs 14A-C in a three phase automation system 10.

Figure 7:
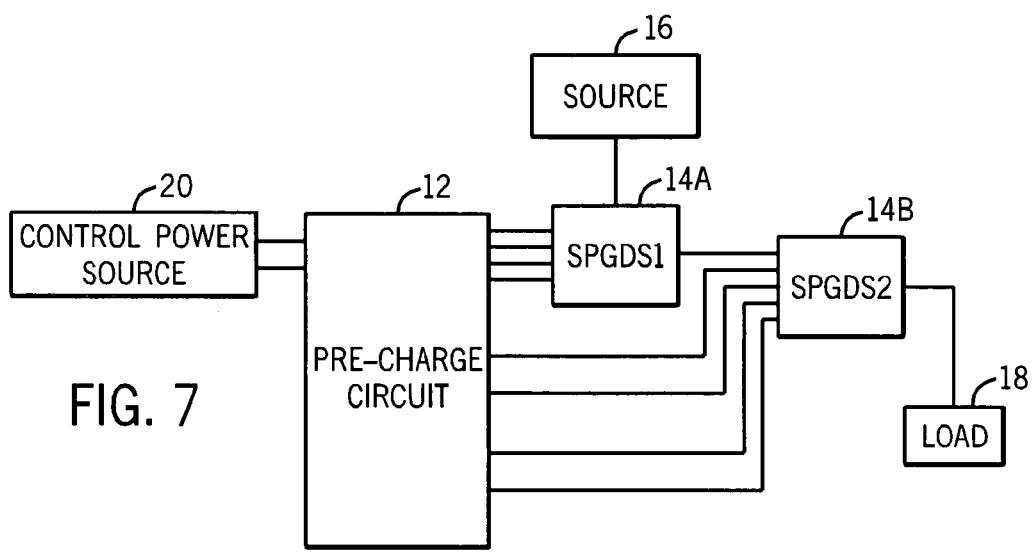
FIG. 7 is a diagrammatical view of an exemplary automation system employing stacked SPGDSs in series with a single phase high voltage power source.

FIG. 7 depicts an exemplary single phase automation system 10 with stacked SPGDSs 14A and 14B to handle higher voltages. The output of SPGDS 14A may be coupled to the input of SPGDS 14B to increase the voltage handing capability of the automation system 10. In some embodiments, the voltage handling capacity may be doubled by stacking two SPGDSs. Like the three phase system, a single pre-charge circuit 12, modified to include two coils and bridge rectifiers for each SPGDS, may charge multiple SPGDSs 14A and 14B.

The three phase power configuration of FIG. 6 and the stacked SPGDSs 14A-B configuration of FIG. 7 may be combined in various ways to produce other embodiments. For example, embodiments in accordance with the present technique include automation systems 10 employing 1 SPGDS per phase to handle 2300 volt power, two SPGDSs per phase to handle 3300 and 4160 volt power, and three SPGDSs per phase to handle 6900 volt power. Thus, adapted to accept three phase power, these embodiments may employ three, six, or nine SPGDSs respectively. As SPGDSs are added to an automation system 10, the advantage of employing a single pre-charge circuit 12 to charge the capacitors in the SPGDSs rather than a pair of individual power supplies for each SPGDS becomes even more apparent.

When supplying multiple SPGDSs with a single pre-charge circuit 12, it may prove advantageous to break up the current loop 22 into segments of wire that are connected to each other in series. The segments may join to a terminal between SPGDSs or a group of SPGDSs. By breaking the current loop 22 into segments, one segment may be removed for repair or maintenance without threading the current loop 22 through every pair of coils associated with every SPGDS.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
a pre-charge circuit configured to couple to a first alternating current power source and charge components within a self powered gate driver system while preventing a current from flowing between the first alternating current power source and the self powered gate driver system; and
at least one self powered gate driver system coupled to the pre-charge circuit, wherein the self powered gate driver system is configured to selectively couple a second alternating current power source and a load.

2. The system of claim 1, wherein the pre-charge circuit comprises a current loop and a coil disposed about the current loop.

3. The system of claim 2, wherein the current loop includes insulation disposed about the current loop between the coil and the current loop.

4. The system of claim 2, wherein the current loop includes between number 4 and number 8 gauge wire that is between 10 and 30 feet in length.

5. The system of claim 1, wherein the pre-charge circuit comprises a transformer.

6. The system of claim 5, wherein the transformer is adapted to step down a voltage of the first alternating current power source to less than 5 volts.

7. The system of claim 1, wherein the pre-charge circuit comprises a bridge rectifier.

8. The system of claim 7, wherein the pre-charge circuit comprises two bridge rectifiers for every self powered gate driver system.

9. The system of claim 1, wherein the pre-charge circuit comprises:
a transformer with an input and an output, wherein the input is coupled to the first alternating current power source;
a current loop coupled to the output of the transformer and configured to induce a current in a coil;
a layer of insulation disposed about the current loop;
a sleeve disposed about the layer of insulation;
a coil disposed about the sleeve; and
a bridge rectifier with an input and an output configured to rectify an alternating current induced in the coil, wherein the input is coupled to the coil and the output is coupled to the self powered gate driver system.

10. The system of claim 1, comprising at least three self powered gate driver systems, wherein at least one self powered gate driver system is configured to selectively couple each phase of a three phase alternating current power source to a load.

11. The system of claim 10, comprising a plurality of self powered gate driver systems coupled to one another in series.

12. A system, comprising:
a current loop configured to induce a current in a coil when carrying an alternating current from a first alternating-current power source;
a plurality of coils coupled to the current loop;
a dielectric disposed between each of the coils and the current loop; and
a self powered gate driver system coupled to a second alternating current power source and to at least one of the coils.

13. The system of claim 12, wherein the self powered gate driver system is coupled to a plurality of coils.

14. The system of claim 12, comprising a rectifier and wherein the self powered gate driver system is coupled to at least one of the coils through the rectifier.

15. The system of claim 12, wherein the self powered gate driver system is configured to selectively couple the second alternating current power source to a load.

16. The system of claim 15, wherein the self powered gate driver system comprises a silicon controlled rectifier.

17. The system of claim 12, wherein the coils are disposed around the current loop.

18. The method of claim 12, wherein charging the self powered gate driver system occurs non-concurrently with selectively coupling a first power source to a load through a self powered gate driver system.

19. A system, comprising:
at least three self powered gate driver systems, wherein at least one self powered gate driver system is configured to selectively couple each phase of a three phase alternating current power source to a load; and
a pre-charge circuit configured to couple to a first alternating current power source and charge components within the at least three self powered gate driver systems while preventing a current from flowing between the first alternating current power source and the at least three self powered gate driver systems, wherein the pre-charge circuit comprises:
a transformer with an input and an output, wherein the input is coupled to the first alternating current power source;
a current loop coupled to the output of the transformer and configured to induce a current in a coil;
a layer of insulation disposed about the current loop;
a sleeve disposed about the layer of insulation;
a coil disposed about the sleeve; and
a bridge rectifier with an input and an output configured to rectify an alternating current induced in the coil, wherein the input is coupled to the coil and the output is coupled to the self powered gate driver system.

20. The system of claim 19, comprising a plurality of self powered gate driver systems coupled to one another in series.

* * * * *

UNITED STATES PATENT AND TRADEMARK OFFICE
CERTIFICATE OF CORRECTION

PATENT NO. : 7,576,451 B2
APPLICATION NO. : 11/237208
DATED : August 18, 2009
INVENTOR(S) : Maclennan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 695 days.

Signed and Sealed this

Seventh Day of September, 2010

David J. Kappos
*Director of the United States Patent and Trademark Office*